United States Patent
Okayama et al.

(10) Patent No.: US 9,958,508 B2
(45) Date of Patent: May 1, 2018

(54) DEGRADED PERFORMANCE RECOVERY METHOD FOR LITHIUM ION SECONDARY BATTERY

(71) Applicant: TOYOTA JIDOSHA KABUSHIKI KAISHA, Toyota-shi, Aichi (JP)

(72) Inventors: Shinobu Okayama, Miyoshi (JP); Satomi Uchida, Kariya (JP)

(73) Assignee: TOYOTA JIDOSHA KABUSHIKI KAISHA, Aichi-ken (JP)

(*) Notice: Subject to any disclaimer, the term of this patent is extended or adjusted under 35 U.S.C. 154(b) by 87 days.

(21) Appl. No.: 15/225,929

(22) Filed: Aug. 2, 2016

(65) Prior Publication Data
US 2017/0040651 A1    Feb. 9, 2017

(30) Foreign Application Priority Data
Aug. 4, 2015 (JP) ................. 2015-154077

(51) Int. Cl.
| | | |
|---|---|---|
| *H01M 10/54* | (2006.01) | |
| *H01M 10/0525* | (2010.01) | |
| *G01R 31/36* | (2006.01) | |
| *H01M 10/48* | (2006.01) | |

(52) U.S. Cl.
CPC ..... *G01R 31/3662* (2013.01); *G01R 31/3679* (2013.01); *H01M 10/0525* (2013.01); *H01M 10/48* (2013.01)

(58) Field of Classification Search
CPC .............. H01M 10/0525; H01M 10/48; G01R 31/3662; G01R 31/3679
See application file for complete search history.

(56) References Cited

U.S. PATENT DOCUMENTS

| | | |
|---|---|---|
| 2006/0154071 A1 | 7/2006 | Homma et al. |
| 2016/0197382 A1* | 7/2016 | Sood ................ G01R 31/3679 429/92 |
| 2017/0038435 A1 | 2/2017 | Mitsuhashi |

FOREIGN PATENT DOCUMENTS

| | | |
|---|---|---|
| JP | 2005-291832 A | 10/2005 |
| JP | 2007-122885 A | 5/2007 |
| JP | 2012-022969 A | 2/2012 |
| JP | 2017-33802 A | 2/2017 |
| KR | 1020050057237 A | 6/2005 |

\* cited by examiner

*Primary Examiner* — Carlos Barcena
(74) *Attorney, Agent, or Firm* — Sughrue Mion, PLLC

(57) ABSTRACT

Provided is a method by which the degraded performance of a lithium ion secondary battery containing phosphorus atoms (P) in a nonaqueous electrolytic solution can be restored by subjecting the lithium ion secondary battery in which a coating film including P is formed on a positive electrode surface, to a comparatively simple treatment. The degraded performance recovery method for a lithium ion secondary battery disclosed herein includes an ultrasound treatment step of applying ultrasound to the lithium ion secondary battery. In the ultrasound treatment step, the frequency of the generated ultrasound is 900 kHz or higher, and the period of time in which the ultrasound is applied to the lithium ion secondary battery continuously is 5 min or more.

4 Claims, 8 Drawing Sheets

DEGRADED PERFORMANCE RECOVERY METHOD FOR LITHIUM ION SECONDARY BATTERY

BACKGROUND OF THE INVENTION

1. Field of the Invention

The present invention relates to a degraded performance recovery method for a lithium ion secondary battery. The present application claims priority to Japanese Patent Application No. 2015-154077 filed on Aug. 4, 2015, the entire contents of which are hereby incorporated by reference.

2. Description of the Related Art

Since lithium ion secondary batteries are less in weight and higher in energy density than the presently available batteries, they have been used in recent years as the so-called portable power sources for personal computers, portable terminals, and the like, and as drive power sources for vehicles. In particular, the lithium ion secondary batteries are expected to be hereinafter increasingly popular as high-output drive power sources for vehicles such as electric vehicles (EV), hybrid vehicles (HV), and plug-in hybrid vehicles (PHV).

However, lithium ion secondary batteries use various rare metals and are relatively expensive. For example, active materials thereof use such rare metal as cobalt (Co). For this reason, from the standpoint of efficiently using natural resources and reducing the running cost, the need for restoring lithium ion secondary batteries which have degraded over a long period of use and extending the service life (ensuring the long life) thereof has been growing year by year.

As a cause of degradation of lithium ion secondary batteries, a process is known in which components in an electrolytic solution are decomposed during charging and discharging, a coating film including, for example, phosphorus atoms as the decomposition product is formed on the electrode surface, and the battery performance is degraded as a result thereof. To resolve this problem, Japanese Patent Application Publication No. 2012-022969 discloses a reuse method by which a spent lithium ion secondary battery is disassembled, the electrodes thereof are washed with a polar solvent to remove the compounds causing the degradation, the electrodes are thereafter dried, and the battery is reassembled.

SUMMARY OF THE INVENTION

In the method for reusing a lithium ion secondary battery disclosed in Japanese Patent Application Publication No. 2012-022969, the spent battery is reused after disassembling, and thus the degraded performance cannot be restored without disassembling the battery. Further, the method for reusing a lithium ion secondary battery disclosed in Japanese Patent Application Publication No. 2012-022969 requires a step of disassembling the battery, a step of washing the electrodes, a step of drying the electrodes, and a step of assembling the battery, the battery needs to be entirely disassembled and the target compounds need to be stripped from the collector, etc., with a strong acid. Thus, from the standpoint of reuse, the method has few cost merits.

With the foregoing in view, there is a need for a method that makes it possible to recover the degraded performance of a lithium ion secondary battery, increase the durability of the lithium ion secondary battery, and extend the service life thereof.

A lithium ion secondary battery of one type includes a nonaqueous electrolytic solution including a compound containing a phosphorus atom (P), such as a phosphate. The investigation conducted by the inventors clearly demonstrated that in the battery of such type, the resistance increase ratio of the lithium ion secondary battery rises, as depicted in FIG. 1, as a coating film including phosphorus atoms is formed on the positive electrode surface.

Accordingly, it is an objective of the present invention to provide a method by which the degraded performance of a lithium ion secondary battery with a nonaqueous electrolytic solution including phosphorus atoms (P) can be restored by subjecting the lithium ion secondary battery in which a coating film including P has formed on the positive electrode surface to a comparatively simple treatment.

The degraded performance recovery method for a lithium ion secondary battery which is disclosed herein is a method for recovering the performance of a lithium ion secondary battery including an electrode body having a positive electrode and a negative electrode and a nonaqueous electrolytic solution including phosphorus atoms (P).

Thus, the degraded performance recovery method for a lithium ion secondary battery which is disclosed herein includes an ultrasound treatment step of applying ultrasound to the lithium ion secondary battery. Further, in the degraded performance recovery method for a lithium ion secondary battery which is disclosed herein, in the ultrasound treatment step, the frequency of the generated ultrasound is 900 kHz or higher, and the period of time in which the ultrasound is applied to the lithium ion secondary battery continuously is 5 min or more.

With such features, at least part of the coating film including phosphorus atoms can be removed from the positive electrode surface by the ultrasound treatment, without disassembling the battery cell. Therefore, with the degraded performance recovery method disclosed herein, the degraded performance of a lithium ion secondary battery can be recovered without performing a large number of steps. As a result, the method excels in the cost merit.

In the preferred aspect of the degraded performance recovery method for a lithium ion secondary battery disclosed herein, the frequency of the generated ultrasound is 2000 kHz or less.

With such a feature, the coating film including phosphorus atoms which is present on the positive electrode surface and causes the performance degradation can be removed more effectively. The ultrasound frequency of 2000 kHz or less is also preferred from the standpoint of preventing the active material from being detached.

In another preferred aspect of the degraded performance recovery method for a lithium ion secondary battery disclosed herein, the period of time in which the ultrasound is applied to the lithium ion secondary battery continuously is 30 min or less.

With such a feature, an excess increase in temperature of the battery in the treatment step can be suppressed and heat-induced degradation can be suppressed.

In another preferred aspect of the degraded performance recovery method for a lithium ion secondary battery disclosed herein, provided after the ultrasound treatment step is a confirmation step of acquiring an evaluation parameter with respect to the lithium ion secondary battery subjected to the ultrasound treatment and determining the degree at which the degradation of the battery performance has been eliminated on the basis of the acquired evaluation parameter.

With such a feature, the degree of degraded performance restoration of the lithium ion secondary battery subjected to ultrasound treatment can be accurately determined. Further, it can be easily determined whether the lithium ion secondary battery can be reused as is according to the degree at which the degradation has been eliminated.

DESCRIPTION OF THE PREFERRED EMBODIMENTS

Figure 2:
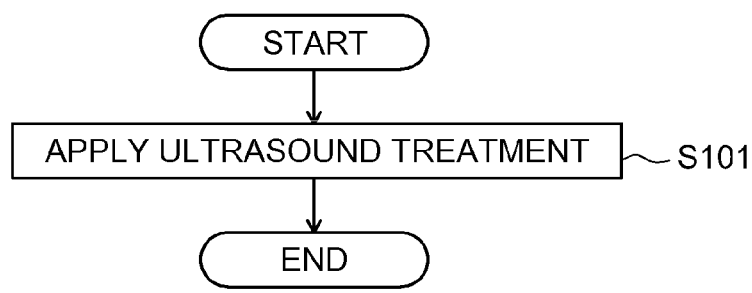
FIG. 2 is a flowchart illustrating the flow of the degraded performance recovery method for a lithium ion secondary battery according to the present invention.

FIG. 2 is a flowchart illustrating the flow of the degraded performance recovery method for a lithium ion secondary battery which is disclosed herein. The degraded performance recovery method for a lithium ion secondary battery which is disclosed herein is a method for recovering the performance of a lithium ion secondary battery including an electrode body having a positive electrode and a negative electrode and a nonaqueous electrolytic solution including phosphorus atoms (P), the method including at least an ultrasound treatment step (step S101) of applying ultrasound to the lithium ion secondary battery.

In the ultrasound treatment step (step S101), the frequency of the generated ultrasound is 900 kHz or higher. The upper frequency of the generated ultrasound is not particularly limited, provided that the objective of the present invention is not impeded, and is typically 5000 kHz or lower, preferably 2000 kHz or lower. The period of time in which the ultrasound is applied to the lithium ion secondary battery continuously is 5 min or more. The upper limit time is not particularly limited, provided that the objective of the present invention is not impeded, and is typically 1 hour or less, preferably, 30 min or less.

The representative embodiment of the degraded performance recovery method for a lithium ion secondary battery according to the present invention will be explained hereinbelow in greater detail with reference to the appended drawings. The present invention is obviously not intended to be particularly limited by the embodiment explained herein. It should be noted that matters necessary for carrying out the present invention other than those specifically referred to in the description are understood to be matters of design for a person skilled in the art which are based on the related art in the pertinent field. Further, the drawings are drawn schematically; for example, the dimensional relationships (length, width, height, etc.) in the drawings do not reflect actual dimensional relationships. The "ultrasound" in the present invention means "vibration waves (sound waves) with a frequency of 30 kHz or higher".

Initially, the structure of a lithium ion secondary battery 100 which is used in the degraded performance recovery method of the present embodiment will be explained below in a simple manner with reference to FIGS. 3 and 4. The "lithium ion secondary battery" in the present specification refers to a secondary battery which uses lithium ions as charge carriers and in which charging and discharging is realized by the movement of electric charges carried by lithium ions between positive and negative electrodes.

Figure 3:
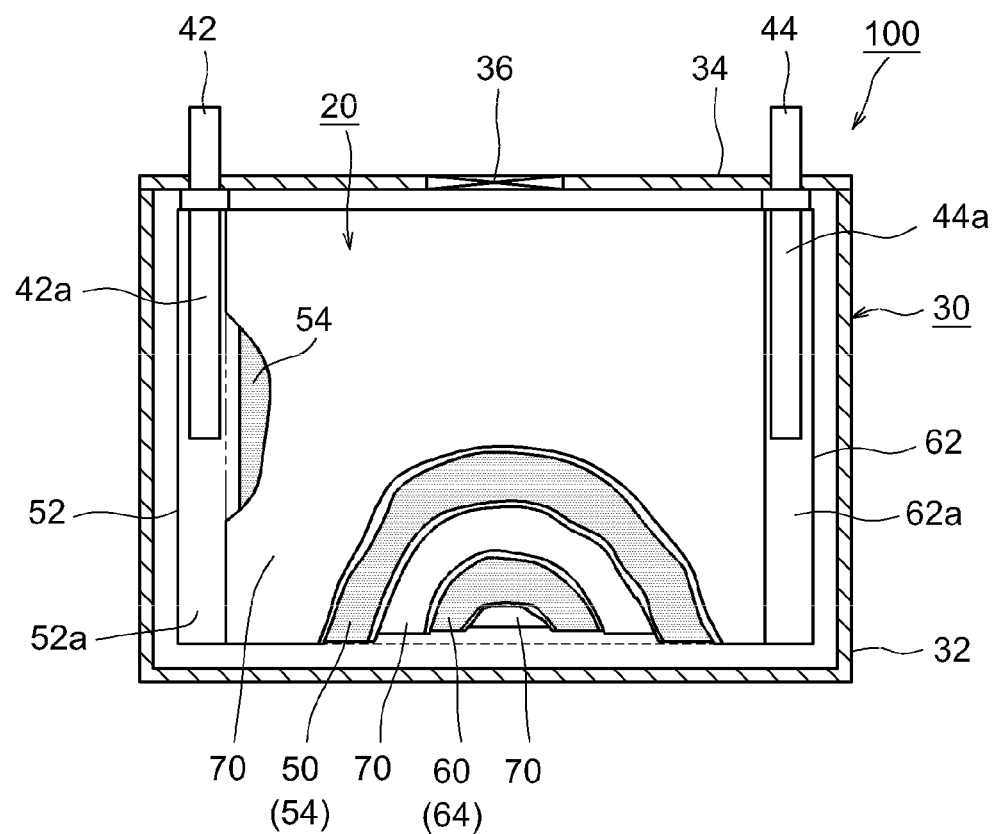
FIG. 3 is a cross-sectional view illustrating schematically the internal structure of the lithium ion secondary battery which is to be treated in an embodiment of the present invention.

In the lithium ion secondary battery 100 depicted in FIG. 3, in rough explanation, a flat wound electrode body 20 and a nonaqueous electrolytic solution (not depicted in the figure) are housed in a sealed battery case (that is, outer case) 30 of a flat angular shape. The battery case 30 is constituted by a box-like (that is, bottomed rectangular parallelepiped) case main body 32 having an opening at one end (corresponds to the upper end in the usual usage state of the battery), and a lid 34 that seals the opening of the case main body 32. For example, a lightweight metal material with good thermal conductivity, such as aluminum, stainless steel, and nickel-plated steel, can be advantageously used for the battery case 30.

Further, as depicted in FIG. 3, the lid 34 is provided with a positive electrode terminal 42 and a negative electrode terminal 44 for external connection, a thin-wall safety valve 36 which is set such as to release the internal pressure of the battery case 30 when the internal pressure rises to a predetermined level or thereabove, and a pouring hole (not depicted in the figure) for pouring the nonaqueous electrolytic solution. A current interrupt device (CID) that is actuated by the increase in the internal pressure of the battery case 30 may be provided inside the battery case 30.

Figure 4:
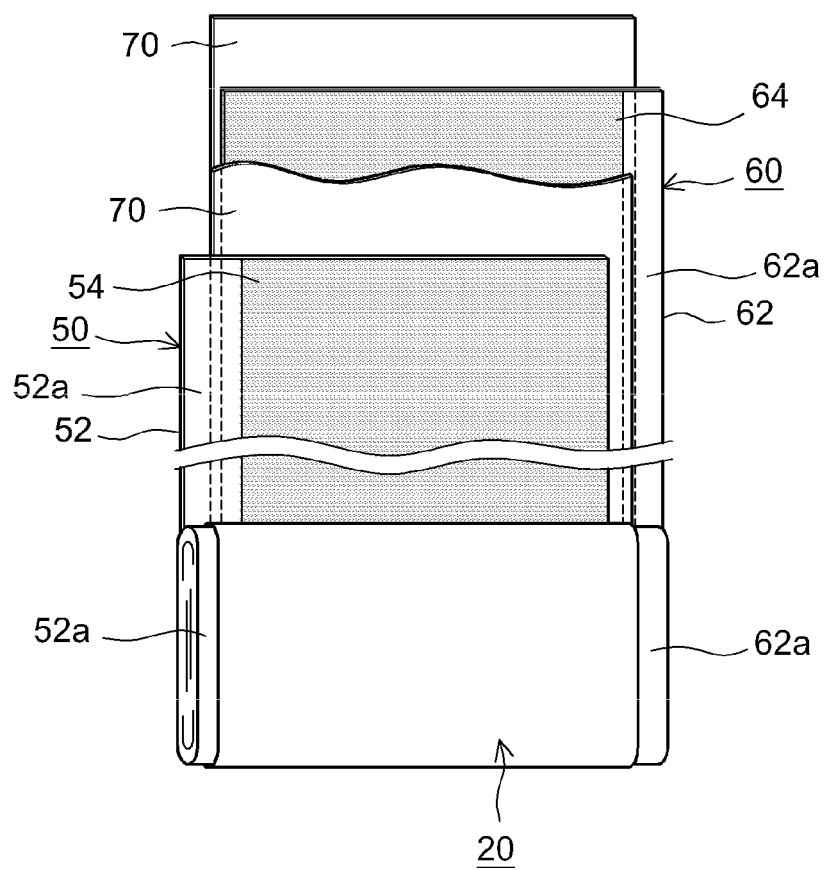
FIG. 4 is a schematic diagram illustrating the entire configuration of the wound electrode body of the lithium ion secondary battery which is to be treated in an embodiment of the present invention.

As depicted in FIGS. 3 and 4, the wound electrode body 20 disclosed herein is obtained by preparing a positive electrode 50, in which a positive electrode active material layer 54 is formed along the longitudinal direction on one or two surfaces (in this case, on two surfaces) of an elongated positive electrode collector 52, and a negative electrode 60, in which a negative electrode active material layer 64 is formed along the longitudinal direction on one or two surfaces (in this case, on two surfaces) of an elongated negative electrode collector 62, laminating the positive electrode and negative electrode, with two elongated separators 70 being interposed therebetween, winding the resultant laminate in the longitudinal direction, and forming into a flattened shape.

As depicted in FIGS. 3 and 4, a wound core portion (that is, the laminated structure in which the positive electrode active material layer 54 of the positive electrode 50, the negative electrode active material layer 64 of the negative electrode 60, and the separators 70 are laminated) is formed in the central portion, in the winding axis direction, of the wound electrode body 20. Parts of a positive electrode active material layer non-formation portion 52a and a negative electrode active material layer non-formation portion 62a protrude outward from the wound core portion at both ends, in the winding axis direction, of the wound electrode body 20. A positive electrode collector 42a and a negative electrode collector 44a are provided at the protruding portion on the positive electrode side (positive electrode active material layer non-formation portion 52a) and the protruding portion on the negative electrode side (negative electrode active material layer non-formation portion 62a), respectively, and electrically connected to the positive electrode terminal 42 and the negative electrode terminal 44, respectively.

For example, an aluminum foil can be used as the positive electrode collector 52 constituting the positive electrode 50. The positive electrode active material layer 54 includes at least a positive electrode active material. Examples of the positive electrode active material include lithium composite metal oxides of a layered structure or spinel structure (for example, $LiNi_{1/3}Co_{1/3}Mn_{1/3}O_2$, $LiNiO_2$, $LiCoO_2$, $LiFeO_2$, $LiMn_2O_4$, $LiNi_{0.5}Mn_{1.5}O_4$, and $LiFePO_4$). The positive electrode active material layer 54 can include components other than the active material, for example, an electrically conductive material or a binder. Carbon black such as acetylene black (AB) and other carbon materials (graphite, etc.) can be advantageously used as the electrically conductive material. Polyvinylidene fluoride (PVDF) can be used as the binder.

For example, a copper foil can be used as the negative electrode collector 62 constituting the negative electrode 60. The negative electrode active material layer 64 includes at least a negative electrode active material. Examples of the negative electrode active material include carbon materials such as graphite, hard carbon, and soft carbon. The negative electrode active material layer 64 can include components other than the active material, for example, a binder and a thickening agent. A styrene-butadiene rubber (SBR) can be used as the binder. For example, carboxymethyl cellulose (CMC) can be used as the thickening agent.

Such positive electrode 50 and negative electrode 60 can be fabricated, for example, in the following manner. Initially, the positive electrode active material or the negative electrode active material and an optional material are dispersed in an appropriate solvent (for example, an organic solvent such as N-methyl-2-pyrrolidone for the positive electrode active material, and an aqueous solvent such as ion exchange water for the negative electrode active material) to prepare a paste-like (slurry-like) composition. The appropriate amount of the composition is then applied to the surface of the positive electrode collector 52 or the negative electrode collector 62, and the solvent is then removed by drying. The properties (for example, average thickness, active material density, and porosity) of the positive electrode active material layer 54 and negative electrode active material layer 64 can be adjusted, as necessary, by performing appropriate press machining.

For example, a porous sheet (film) constituted by a resin such as polyethylene (PE), polypropylene (PP), polyester, cellulose, and polyamide can be used as the separator 70. The porous sheet may have a monolayer structure or a laminated structure constituted by two or more layers (for example, a three-layer structure in which a PP layer is laminated on each surface of a PE layer). A heat-resistance layer (HRL) may be provided on the surface of the separator 70.

An organic solvent (nonaqueous solvent) including a support salt typically can be used as the nonaqueous electrolytic solution. Various organic solvents such as carbonates, ethers, esters, nitriles, sulfones, and lactones, which can be used in an electrolytic solution of a typical lithium ion secondary battery, can be used without any particular limitation. Specific examples thereof include ethylene carbonate (EC), propylene carbonate (PC), diethyl carbonate (DEC), dimethyl carbonate (DMC), and ethylmethyl carbonate (EMC). Such nonaqueous solvents can be used individually or in combinations of two or more thereof. For example, a lithium salt such as $LiPF_6$, $LiBF_4$, and $LiClO_4$ can be advantageously used as the support salt. $LiPF_6$ is a particularly preferred support salt. The concentration of the support salt is preferably no less than 0.7 mol/L and no more than 1.3 mol/L.

The nonaqueous electrolytic solution can include components other than the above-described nonaqueous solvent and support salt, for example, a gas-generating agent such as biphenyl (BP) and cyclohexylbenzene (CHB); a film-forming agent such as an oxalate complex compound including a boron atom and/or a phosphorus atom, vinylene carbonate (VC), and fluoroethylene carbonate (FEC); a dispersant; and a thickening agent. As mentioned hereinabove, the present invention is implemented with respect to a target lithium ion secondary battery in which a coating film including P can be formed. Therefore, the nonaqueous electrolytic solution includes a compound containing a phosphorus atom (P). For example, a nonaqueous electrolytic solution can be used that includes the abovementioned $LiPF_6$ as the compound containing P.

A degraded performance recovery method for a secondary battery of the present embodiment will be explained hereinbelow with reference to FIG. 5.

Figure 5:
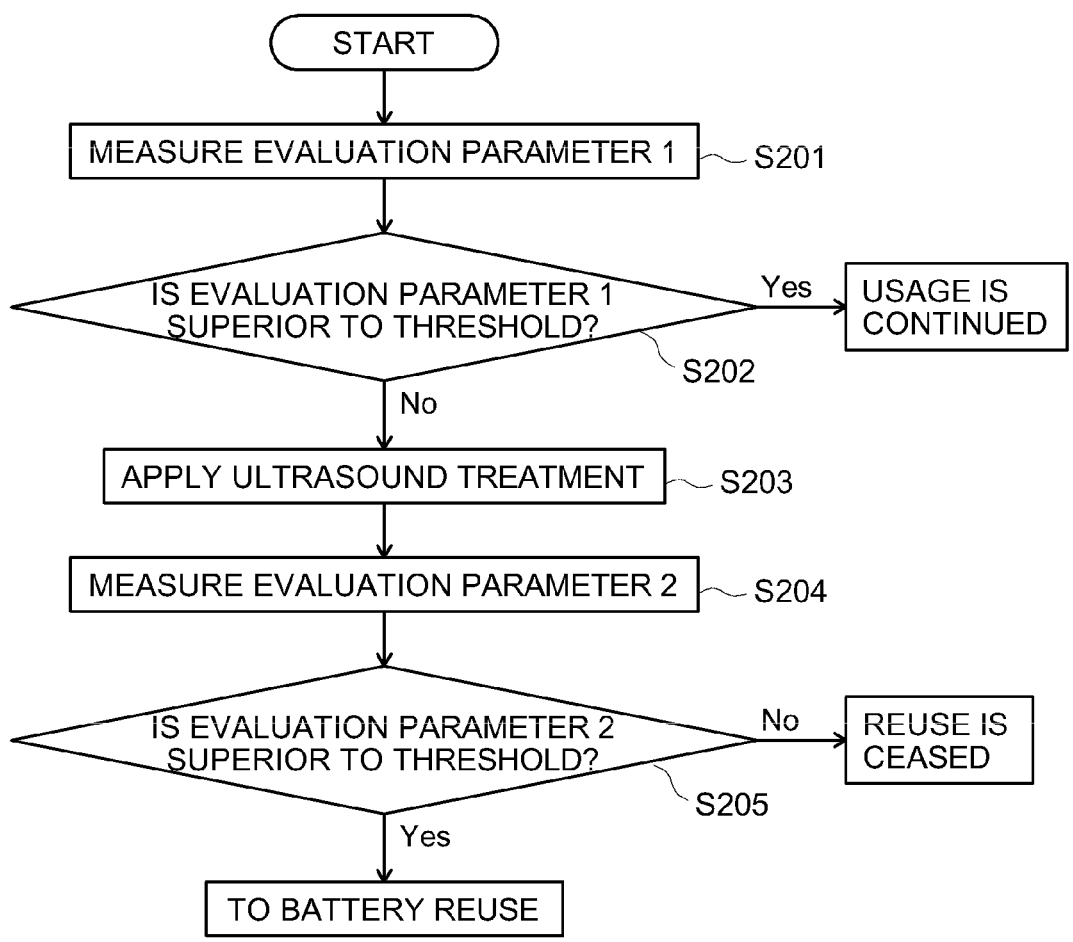
FIG. 5 is a flowchart illustrating the flow of the degraded performance recovery method for a lithium ion secondary battery according to an embodiment of the present invention.

FIG. 5 is a flowchart illustrating the flow of the degraded performance recovery method for a lithium ion secondary battery according to the present embodiment.

Initially, in step S201, an evaluation parameter 1 is measured in order to determine whether or not a degradation has occurred in the lithium ion secondary battery 100 including the electrode body 20 having the positive electrode 50 and the negative electrode 60 and a nonaqueous electrolytic solution including phosphorus atoms (P). Specific examples of the evaluation parameter 1 include resistance or resistance increase ratio, the number of charge cycles, and voltage in the fully charged state of the lithium ion secondary battery. When the lithium ion secondary battery is used in a battery pack, the voltage, resistance, or number of charge cycles of the battery pack may be used as the evaluation parameter 1. When the lithium ion secondary battery is used in a vehicle, or the like, the distance travelled by the vehicle or the temperature history thereof may be measured as the evaluation parameter 1 instead of the internal resistance of the lithium ion secondary battery itself.

Then, in step S202, the measured evaluation parameter 1 is compared with a predetermined threshold, and thereby it is determined whether or not the lithium ion secondary battery 100 has degraded. In this case, where the value of the measured evaluation parameter 1 is superior to the threshold (determination line value), the lithium ion secondary battery 100 can be continuously used, without performing the following steps S203 to S205. Where the value of the measured evaluation parameter 1 is equal to or less than the threshold (determination line value), that is, when it is poor (degraded), the processing flow advances to the next step S203.

Steps S201 and S202 are not required to be performed with respect to each of the individually prepared batteries, provided that a step corresponding to step S101 in FIG. 2 (that is, a step in which a battery for which the performance is determined to have degraded on the basis of the evaluation parameter 1) is present. In other words, those two steps are optional, rather than mandatory, in the degraded performance recovery method disclosed herein. For example, when a plurality of unit batteries (lithium ion secondary batteries) which have been used under the same conditions in the same battery pack is included, it is possible to select a certain single unit battery as a representative battery among the plurality of unit batteries, perform the evaluation of the selected unit battery by comparing the evaluation parameter 1 (for example, the value of internal resistance) with a threshold, and determine whether or not the single unit battery has degraded, thereby enabling the omission of the determination (that is, steps S201 and S202) with respect to the remaining unit batteries constituting the battery pack. This is because it can be determined, on the basis of the same evaluation parameter (for example, the internal resistance value), that the performance has degraded with respect to the remaining unit batteries which constitute the same battery pack and have been used under the same conditions. In this case, it can be also said that step S101 in FIG. 2 has been implemented with respect to individual unit batteries.

Where there is a plurality of measured parameters 1, the comparison with the predetermined threshold and determination may be performed using only the value of a representative parameter 1, without comparing each individual parameter 1.

Figure 6:
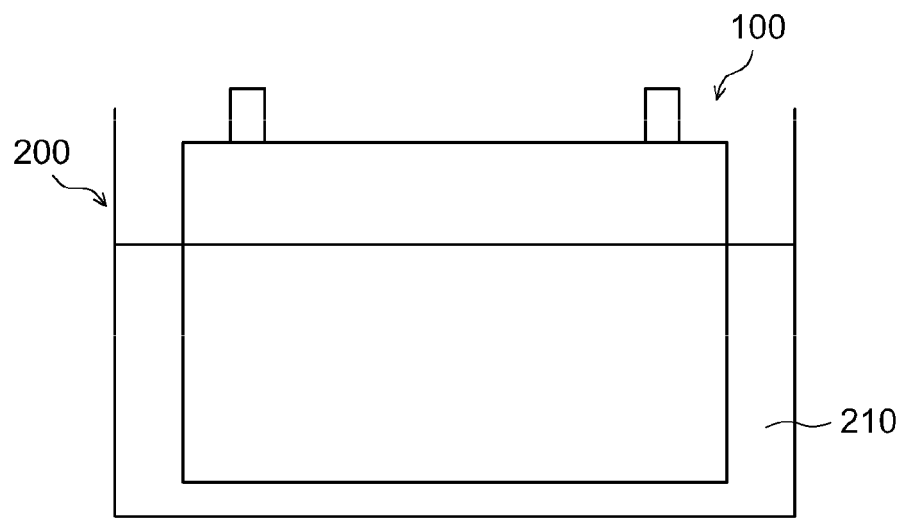
FIG. 6 is a schematic diagram illustrating the configuration of the device for ultrasound treatment of the lithium ion secondary battery in an embodiment of the present invention.

In step S203, the lithium ion secondary battery 100 is applied with ultrasound (ultrasound treatment). The ultrasound treatment may be performed, as depicted in FIG. 6, by immersing the target lithium ion secondary battery 100 in a medium 210 (typically, water) capable of transmitting ultrasound waves, and applying to the battery with ultrasound from a typical ultrasound treatment device 200 through the medium 210, but the present embodiment is not limited to this procedure. As a result of the lithium ion secondary battery 100 being applied with ultrasound, the positive electrode in the lithium ion secondary battery 100 is vibrated, and the coating film having phosphorus atoms which has adhered to the positive electrode surface can be stripped from the positive electrode surface. The frequency and time for the generated ultrasound may be set in the same manner as in step S102.

Figure 7A:
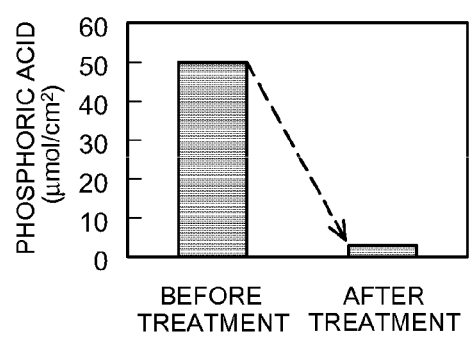
FIG. 7A is a graph illustrating changes in the amount of the coating film including phosphorus atoms (in terms of phosphoric acid: mol/cm$^2$) which are caused by the treatment in an embodiment of the present invention.
Figure 7B:
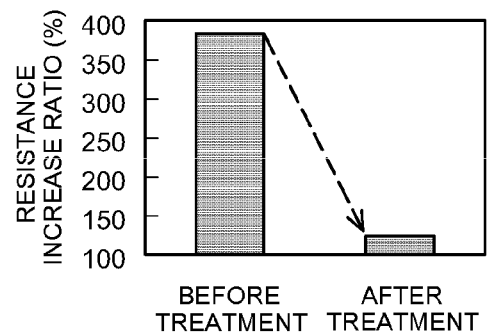
FIG. 7B is a graph illustrating changes in the resistance increase ratio (%) which are caused by the treatment in an embodiment of the present invention.

In this case, FIGS. 7A and 7B show changes in the amount of the coating film including phosphorus atoms (in terms of phosphoric acid: $mol/cm^2$) on the positive electrode surface (specifically, the surface of the positive electrode active material) and changes in the resistance increase ratio (%) in the lithium ion secondary battery observed when application is conducted, for example, continuously for 15 min at a frequency of 900 kHz. Details relating to the materials and test methods are the same as in the below-described example 1 (example with a frequency of 900 kHz). FIGS. 7A and 7B clearly indicate that the ultrasound treatment removes the coating film including phosphorus atoms from the positive electrode surface and decreases the resistance increase ratio of the lithium ion secondary battery.

Then, in step S204, an evaluation parameter 2 is measured with respect to the lithium ion secondary battery 100, which has been subjected to the ultrasound treatment, to confirm the degradation recovery state. Specific examples of the evaluation parameter 2 include the resistance or resistance increase ratio and voltage in the fully charged state of the lithium ion secondary battery. When the lithium ion secondary battery is used in a battery pack, the voltage or resistance of the battery pack obtained after assembling the lithium ion secondary battery in the battery pack may be used.

The evaluation parameter 2 may be the same as, or different from the evaluation parameter 1. For example, by setting the evaluation parameter 1 and the evaluation parameter 2 as the same parameter, it is possible to determine accurately the degree of recovery of degraded performance by the ultrasound treatment. Further, for example, when the lithium ion secondary battery is used in a vehicle, the evaluation parameters can be measured in a simpler manner by taking the distance travelled by the vehicle as the evaluation parameter 1 and the internal resistance of lithium ion secondary battery as the evaluation parameter 2. Thus, by combining, as appropriate, the evaluation parameter 1 and the evaluation parameter 2, it is possible to realize a better method for recovering the degraded performance of the lithium ion secondary battery.

Then, in step S205, the measured evaluation parameter 2 is compared with a predetermined threshold and thereby it is determined whether or not the lithium ion secondary battery 100 has degraded. Where the value of the measured evaluation parameter 2 is superior to the threshold, it is considered that the degraded performance of the lithium ion secondary battery 100 has been recovered and the battery can be reused. Where the value of the measured evaluation parameter 2 is less than the threshold, it is assumed that the degraded performance could not be sufficiently restored, and it can be further determined whether or not to cease the reuse of the lithium ion secondary battery and whether to perform the ultrasound treatment again.

A single threshold or a plurality of thresholds may be predetermined in step S205. When a plurality of thresholds is set, methods for reusing the battery may be classified according to the degree of recovery of the degraded performance of the lithium ion secondary battery. For example, in the case of the lithium ion secondary battery which has been used for a vehicle, two thresholds, namely, a threshold A and a threshold B which is larger than the threshold A, may be provided, the battery for which the value of the evaluation parameter 2 measured in step S204 falls between the threshold A and the threshold B may be reused as a stationary household power source, and a battery with the measured value superior to (larger than) the threshold B may be reused for the vehicle. In the degraded performance recovery method disclosed herein, steps S204 and S205 are optional rather than mandatory.

As mentioned hereinabove, the investigation conducted by the inventors has clearly indicated that a coating film including phosphorus atom which is present on the positive electrode surface of a lithium ion secondary battery can be removed by subjecting the lithium ion secondary battery to the ultrasound treatment of the present embodiment. Further, since the coating film having phosphorus atoms can be removed without disassembling the lithium ion secondary battery, the degraded performance recovery method of the present embodiment is superior in the cost merit to the conventional techniques.

Examples are described hereinbelow.

EXAMPLE 1: INVESTIGATION OF THE FREQUENCY OF ULTRASOUND AND THE COATING FILM HAVING PHOSPHORUS ATOMS

The relationship between the frequency of ultrasound with which a lithium ion secondary battery is applied and the coating film including phosphorus atoms in the lithium ion secondary battery was investigated in detail as Example 1. Initially, 16 lithium ion secondary batteries having a coating film with a phosphorus atom concentration of 50 μmol/cm² on the positive electrode surface were prepared by implementing a predetermined number of charge-discharge cycles with respect to flat lithium ion secondary batteries having a wound electrode body and a nonaqueous electrolytic solution including $LiPF_6$ as an additive, those batteries being illustrated by FIGS. 3 and 4.

Then, each of the prepared lithium ion secondary batteries 100 were applied with ultrasound for 15 min at a frequency of 500 kHz to 2000 kHz. In the obtained lithium ion secondary batteries, a sample was taken from the positive electrode surface and the amount of phosphorus atoms in the coating film on the positive electrode surface after the ultrasound treatment was measured using an ion chromatography mass spectrometer. The results are depicted in FIG. 8.

Figure 1:
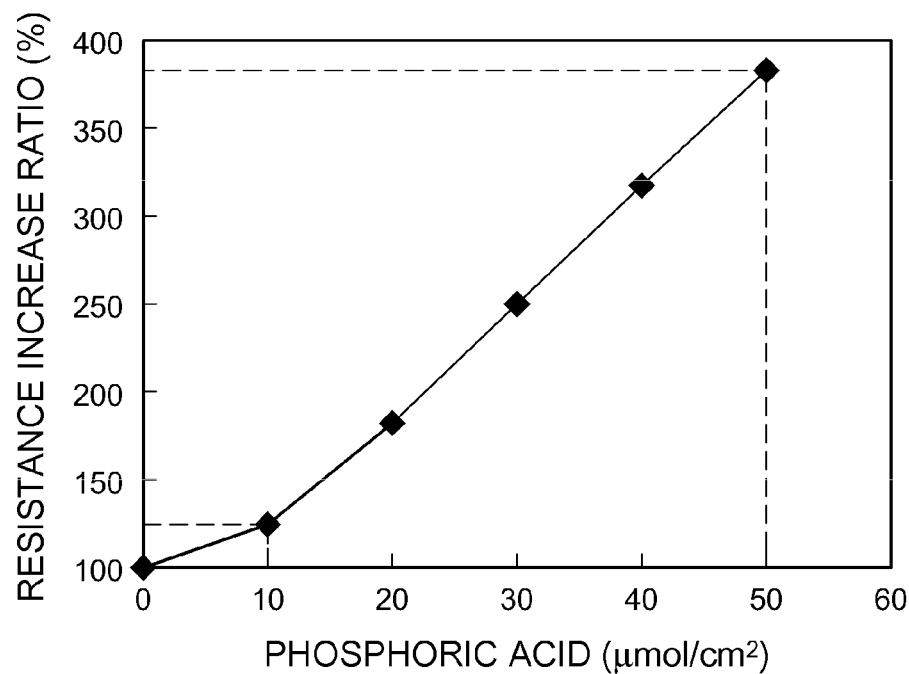
FIG. 1 is a graph illustrating the relationship between the coating film including phosphorus atoms (in terms of phosphoric acid: mol/cm$^2$) and the resistance increase ratio (%) in a lithium ion secondary battery.
Figure 8:
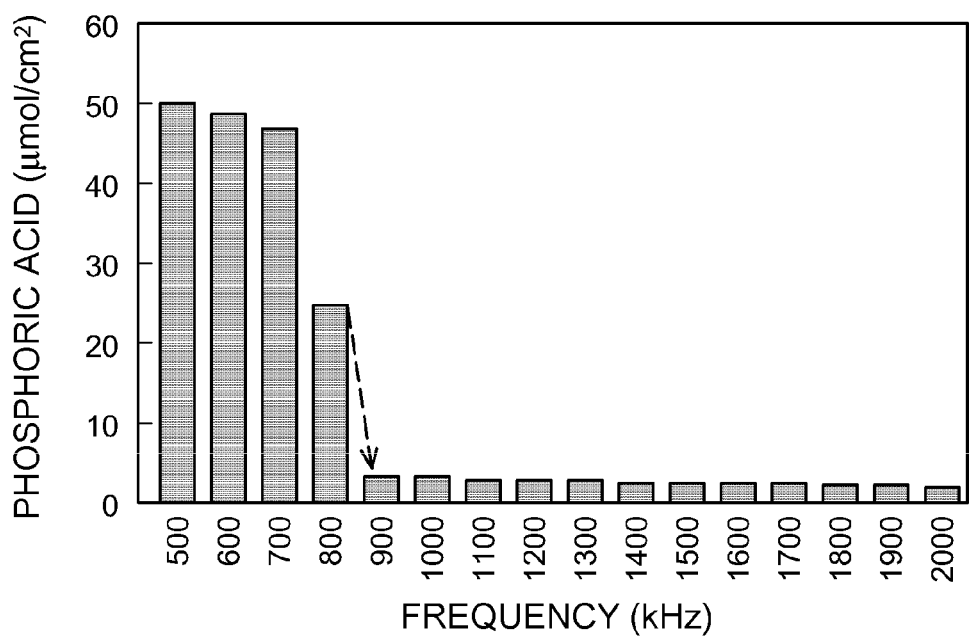
FIG. 8 is a graph illustrating the relationship between the amount of the coating film including phosphorus atoms (in terms of phosphoric acid: mol/cm$^2$) and the frequency (kHz) of ultrasound treatment in an embodiment of the present invention.

FIG. 8 demonstrates that when the treatment is performed at a frequency of 900 kHz or higher, the amount of the coating film having phosphorus atoms is reduced more significantly. Since FIG. 1 indicates that the resistance increase ratio (performance degradation) decreases with the reduction in the amount of the coating film having phosphorus atoms, by combining the results illustrated by FIG. 7, it can be found that the resistance of the lithium ion secondary battery can be greatly reduced by performing the treatment at a frequency of 900 kHz or higher.

EXAMPLE 2: INVESTIGATION OF THE ULTRASOUND APPLICATION TIME AND THE COATING FILM HAVING PHOSPHORUS ATOMS

The inventors have investigated in detail the effect produced by the period of time in which ultrasound is applied to a lithium ion secondary battery.

Initially, seven lithium ion secondary batteries having a coating film with a phosphorus atom concentration of 50 μmol/cm² on the positive electrode surface were prepared as lithium ion secondary batteries 100 in the same manner as in Example 1. Then, the prepared lithium ion secondary batteries 100 were applied with ultrasound at 900 kHz for 1, 5, 10, 15, 20, 25, and 30 min, respectively. In the obtained lithium ion secondary batteries, a sample was taken from the positive electrode surface and the amount of phosphorus atoms in the coating film on the positive electrode surface after the ultrasound treatment was measured using an ion chromatography mass spectrometer. The results are depicted in FIG. 9.

Figure 9:
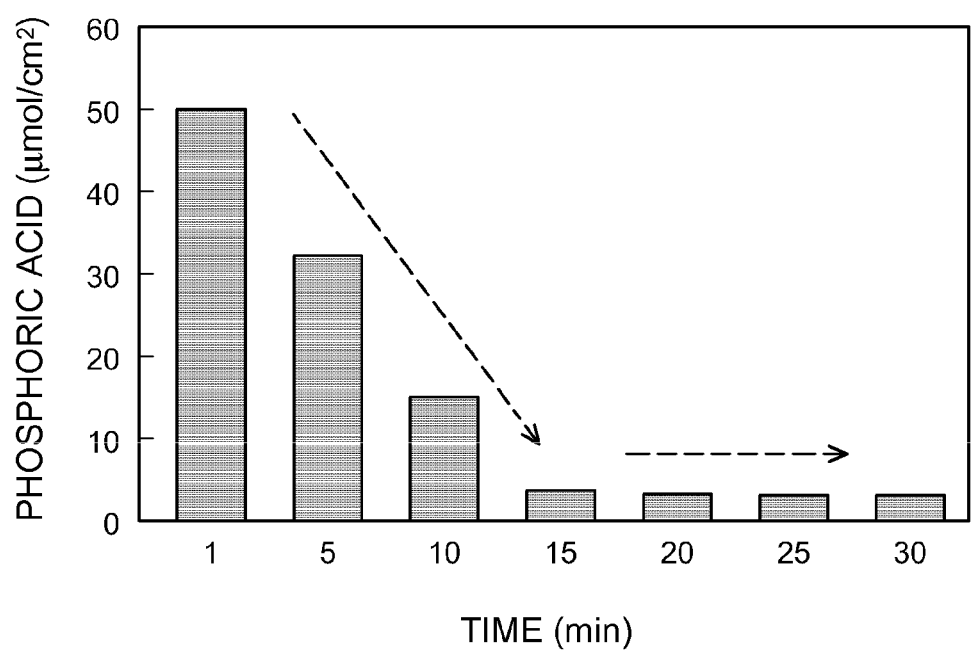
FIG. 9 is a graph illustrating the relationship between the amount of the coating film including phosphorus atoms (in terms of phosphoric acid: mol/cm$^2$) and the time (min) of ultrasound treatment in an embodiment of the present invention.

FIG. 9 demonstrates that when the ultrasound treatment is performed on the lithium ion secondary battery for 5 min or longer, the amount of the coating film having phosphorus atoms is reduced. In particular when the treatment time is 15 min or longer, the effect of suppressing the amount of the coating film having phosphorus atoms is significant. Since FIG. 1 indicates that the resistance increase ratio (performance degradation) decreases with the reduction in the amount of the coating film having phosphorus atoms, by combining the results illustrated by FIG. 7, it can be found that the degraded performance of a lithium ion secondary battery can be recovered by continuously treating the lithium ion secondary battery for 5 min or more at a frequency of 900 kHz or higher.

EXAMPLE 3: INVESTIGATION OF THE ULTRASOUND APPLICATION TIME AND BATTERY THICKNESS

The inventors have confirmed that the degraded performance recovery method for a lithium ion secondary battery which is disclosed herein is effective regardless of the thickness of the lithium ion secondary battery.

Initially, battery cases with a length of 1 cm and 2.5 cm in the thickness direction of the electrode body housing portion (the length, in the lamination direction of the electrode body, of the cavity in which the electrode body is housed) were used, and lithium ion secondary batteries having a coating film with a phosphorus atom concentration of 50 μmol/cm² on the positive electrode surface in the electrode body with a thickness corresponding to the length in the thickness direction of the respective electrode body housing portion were prepared in the same manner as in Example 1. The prepared lithium ion secondary batteries 100 were each applied with ultrasound with a frequency 900 kHz, and the time required to demonstrate the same effect of reducing the coating film amount in the two batteries was investigated. The results are shown in FIG. 10.

Figure 10:
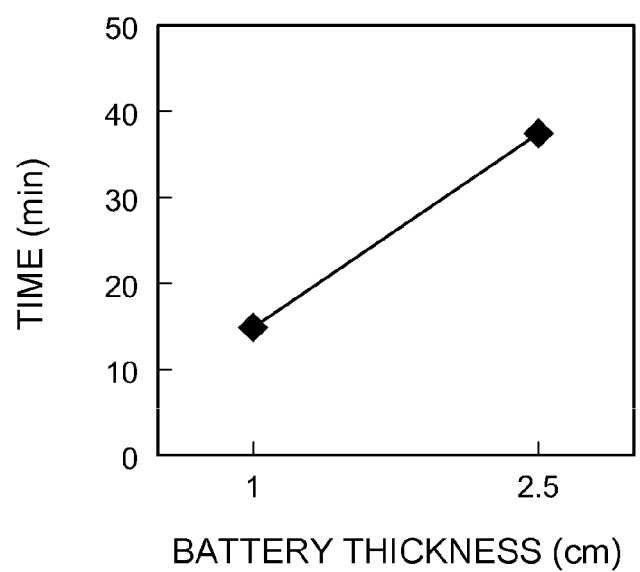
FIG. 10 is a graph illustrating the relationship between the thickness (cm) of electrode body and the time (min) of ultrasound treatment in an embodiment of the present invention.

The results in FIG. 10 confirm that by adjusting the time of continuous ultrasound application with respect to the lithium ion secondary battery with a battery case thickness of 2.5 cm, it is possible to obtain the same effect as in the case of the thin battery case.

The results described hereinabove confirm that the degraded performance of a lithium ion secondary battery equipped with an electrode body having a positive electrode and a negative electrode and a nonaqueous electrolytic solution including phosphorus atoms (P) can be recovered by continuously applying ultrasound with a frequency of 900 kHz or higher to the lithium ion secondary battery for 5 min or longer. Further, it was confirmed that the continuous ultrasound application time at which the effect of degraded performance restoration of a lithium ion secondary battery reaches a maximum differs depending on the battery thickness.

The lithium ion secondary battery with restored performance can be used for a variety of applications. For example, the lithium ion secondary battery which has been used for vehicles can be advantageously reused as a drive power source to be installed on vehicles such as plug-in hybrid vehicles (PHV), hybrid vehicles (HV), and electric vehicles (EV).

The specific examples of the present invention are described hereinabove in detail, but those examples place no limitation on the claims. Thus, the techniques set forth in the claims are inclusive of various changes and modifications of the above-described specific examples.

In the above-described embodiment, the lithium ion secondary battery uses a wound electrode body. However, the degraded performance recovery method for a lithium ion secondary battery which is disclosed herein is not limited to such a battery and may be applied to a laminated electrode body obtained by laminating a plurality of negative electrodes, a plurality of separators, and a plurality of positive electrodes.

Further, in the above-described embodiments, an angular nonaqueous electrolyte secondary battery is used. However, the degraded performance recovery method for a lithium ion secondary battery which is disclosed herein is not limited to such a battery and may be applied to a cylindrical nonaqueous electrolyte secondary battery.

What is claimed is:

1. A degraded performance recovery method for a lithium ion secondary battery including an electrode body having a positive electrode and a negative electrode and a nonaqueous electrolytic solution including phosphorus atoms (P), the method comprising:
    an ultrasound treatment step of applying ultrasound to the lithium ion secondary battery, wherein
    in the ultrasound treatment step, the frequency of the generated ultrasound is 900 kHz or higher, and a period of time in which the ultrasound is applied to the lithium ion secondary battery continuously is 5 min or more.

2. The degraded performance recovery method for a lithium ion secondary battery according to claim 1, wherein the frequency of the generated ultrasound is 2000 kHz or less.

3. The degraded performance recovery method for a lithium ion secondary battery according to claim 1, wherein the period of time in which the ultrasound is applied to the lithium ion secondary battery continuously is 30 min or less.

4. The degraded performance recovery method for a lithium ion secondary battery according to claim 1,
    the method comprising, after the ultrasound treatment step, a confirmation step of acquiring an evaluation parameter with respect to the lithium ion secondary battery subjected to the ultrasound treatment and determining a degree at which the degradation of the battery performance has been eliminated on the basis of the acquired evaluation parameter.

* * * * *